United States Patent [19]
Chu et al.

[11] 4,376,267
[45] Mar. 8, 1983

[54] VIDEO PREAMPLIFIER FOR LASER SYSTEMS

[75] Inventors: Tien W. Chu, Orlando; Thomas W. Holland, Altamonte Springs, both of Fla.

[73] Assignee: Martin Martietta Corporation, Bethesda, Md.

[21] Appl. No.: 209,580

[22] Filed: Nov. 24, 1980

[51] Int. Cl.³ .............................................. H03G 3/10
[52] U.S. Cl. .................................... 330/284; 330/278
[58] Field of Search ............... 330/133, 145, 254, 278, 330/284; 455/241, 247

[56] References Cited
U.S. PATENT DOCUMENTS
3,810,035 5/1974 Gundry ............................. 330/145
4,147,991 4/1979 Ijichi et al. ......................... 330/284

FOREIGN PATENT DOCUMENTS
54-100644 8/1979 Japan ................................. 330/133

Primary Examiner—James B. Mullins
Assistant Examiner—Gene Wan
Attorney, Agent, or Firm—Duckworth, Allen, Dyer & Pettis

[57] ABSTRACT

An automatic gain controlled preamplifier for use with a laser detector and having a wide bandwidth and a low-noise figure. The preamplifier includes a voltage controlled input attenuator stage feeding a low noise wideband amplifier stage which drives an output amplifier stage. Each stage has independent AGC drivers which permit sequential control of the three stages by AGC voltages of different ranges. The output stage is controlled for low level signals, the attenuator stage for medium level signals, and the low noise stage by large signals, thereby maintaining the low noise characteristic for weak signals. The preamplifier is implemented in form for production as a monolithic circuit.

18 Claims, 6 Drawing Figures

VIDEO PREAMPLIFIER FOR LASER SYSTEMS

BACKGROUND OF THE INVENTION

1. Field of the Invention

The present invention relates to a low noise video preamplifier, and in particular to a low noise video preamplifier having very wide dynamic range and suitable for use with laser guided weapon systems.

2. Description of the Prior Art

Laser-guided weapon systems generally utilize multiple laser detectors which typically detect very short pulses of laser energy at a relatively low repetition rate. The intensity of the received energy and, consequently, the peak value of each pulse may vary widely over the trajectory of the weapon. Movement of the target, changes in reflectivity, variations in the propagation path, presence of smoke and other obstructions in the optical path, and similar factors can produce rapid and large variations in signals from the detector. To obtain reliable control signals for operation of the guidance system, it is necessary to maintain amplitude proportionality among the received pulses. Therefore, stringent requirements are placed on the automatic gain control circuits of such a system to prevent overloading, clipping, and other nonlinearities in the signal circuits.

An additional requirement is for circuits that can be produced in LSI form for use with small ordnance devices such as cannon launched projectiles. Generally, a preamplifier may be utilized which is driven by the laser detector and which has its gain controllable by means of an automatic gain control (AGC) voltage produced by the signal processing circuits. The preamplifier requires a very wide bandwidth to be able to pass the narrow pulses and is required to have a very low noise figure. A typical dynamic range to be achieved is on the order of 120 dB. Although gain controlled preamplifiers are well known in the prior art, none having the requisite wide dynamic range, low noise characteristic, and wide bandwidth which could be implemented in monolithic form was known.

SUMMARY OF THE INVENTION

The present invention is an AGC controlled preamplifier in accordance with the above described requirements. The preamplifier comprises three basic elements; an output amplifier having its gain controlled by a first AGC voltage; an input attenuator which is electronically controllable from a second AGC voltage; and a low noise wideband amplifier controllable from a third AGC voltage. The output amplifier is connected to receive amplified pulses from the low noise amplifier and therefore operates at a high level and contributes negligible noise. Its gain is controlled over a range of AGC voltage from zero for a minimum detectable signal level to a voltage representative of a signal, although weak, that is large relative to the noise contribution of the low noise amplifier. A reduction in gain of about 20 dB may be obtained.

As the input signal level to the preamplifier continues to increase, the electronically controllable attenuator is controlled to reduce the preamplifier gain. The attenuator is a network of shorted collector-base transistors and resistors capable of handling the maximum input signal current. A set of AGC drivers is connected to the transistors such that a dc current from the drivers will vary the dynamic resistance of the attenuator transistor emitters responsive to an externally supplied AGC voltage. As the resistance of an attenuator transistor is reduced, the input signal current is partially shunted to ground. Utilization of four transistors stages and three series resistors produces about 50 dB of attenuation. The signal controlled by the attenuator is fed to the low noise wideband amplifier which consists of a common emitter cascode stage having a voltage amplification of about 100. Two emitter followers are provided for impedance transformation. For the driving requirements of the output amplifier, a complementary class AB output stage having good output pulse response and low standby power dissipation is provided. The amplifier gain is controlled by an externally applied AGC voltage with delays achieved by biasing such that gain reduction occurs only for very high AGC voltages. About 30 dB control range may be realized. Feedback is applied around the common emitter cascode stage to obtain the proper pulse transimpedance. A feedback capacitor is used to produce an upper cutoff frequency of about 16 MHz.

In operation, the output amplifier will be controlled in gain over a range of AGC voltages from 0 to $-2$ volts producing about 20 dB gain reduction. The first two attenuator transistors will cause the gain in the attenuator to be reduced up to about 20 dB for an AGC voltage over the range of $-2$ to $-4$ volts. The second two attenuator transistors will cause the gain in the attenuator to be reduced up to about 30 dB for an AGC voltage over the range of $-4$ to $-7$ volts. The remainder of the gain reduction from about 70 dB to 100 dB takes place in the variation of the preamplifier gain for an AGC voltage in the range of $-7$ to $-10$ volts. Component values and operating points of the active devices are selected to provide a very linear control of gain over the 100 dB range for a variation of AGC voltage from 0 to $-10$ volts.

A minimum number of capacitors is utilized in the preamplifier and the circuits are easily adapted to a monolithic embodiment. For example, four such preamplifiers have been fabricated on a single chip and utilized for each of four laser detectors arranged to produce quadrature control signals for controlling the attitude of the weapon system.

It is therefore a principal object of the invention to provide a wide bandwidth, low noise preamplifier which is controllable by externally generated dc gain control signals to have a dynamic range on the order of 120 dB.

It is another object of the invention to provide an AGC controlled preamplifier having a wide bandwidth and a wide dynamic range that can be implemented in monolithic form.

It is yet another object of the invention to provide an automatic gain controlled low noise preamplifier in which an output amplifier is gain controlled for a range of weak signals without degradation of the preamplifier noise characteristics.

It is still another object of the invention to provide a preamplifier having an AGC voltage controlled attenuator for controlling the preamplifier gain responsive to AGC voltages representative of a range of signals well above the preamplifier noise level, followed by a low noise transistor amplifier stage controllable by an AGC voltage having a value in a higher range than that applied to the attenuator section.

It is still a further object of the invention to provide a monolithic AGC control preamplifier having four separate channels.

These and other objects and advantages of the invention will become apparent from the following detailed description and the drawings.

DETAILED DESCRIPTION OF THE PREFERRED EMBODIMENT

Figure 1:
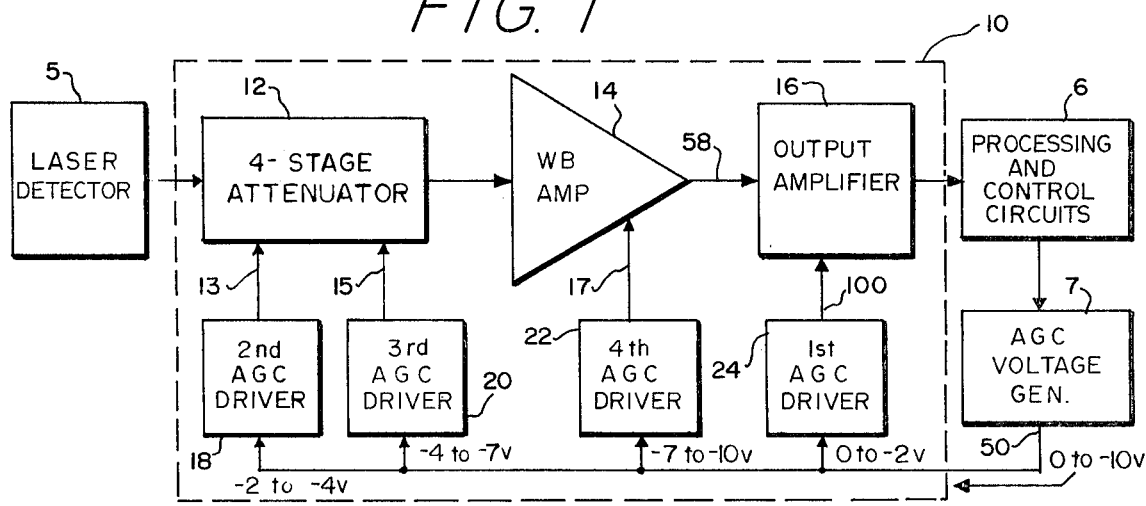
FIG. 1 is a simplified block diagram of the preamplifier of the invention in a typical laser guidance system.

Referring to FIG. 1 of the drawings, a simplified block diagram of the wide dynamic range preamplifier of the invention is shown at 10 as connected into a typical laser guidance system. Such guidance systems will normally utilize four channels to provide azimuth and elevation control and it is to be understood that FIG. 1 is illustrative of one of such channels. Laser detector 5 produces an output voltage in response to incident laser radiation. The output from laser detector 5 represents the signal input to the preamplifier 10 and connects first to four-stage attenuator 12. The output of attenuator 12 drives wideband amplifier 14 which is designed to have a very low noise figure. The output from amplifier 14 connects to an output amplifier 16 which drives the succeeding processing and control circuits 6 of the guidance system. It is to be understood that the signals from output amplifier 16 will be a sequence of very narrow pulses having a low repetition rate with circuit noise appearing on the base line between pulses. The amplitude of the pulse in each channel is utilized to determine error in heading of the vehicle in which the guidance system is installed. For example, the processing control circuits 6 must compare the amplitude of a pulse in one of the azimuth channels to the amplitude of the pulse in the other azimuth channel to thereby develop the necessary control signals for reducing the vehicle azimuth error to zero. Therefore, it is essential that the preamplifier circuit 10 be operated within its linear capabilities without limiting or otherwise overloading. It is conventional to utilize holding circuits in the process and control circuits 6 to hold the amplitude of each received pulse in each channel for developing an automatic gain control (AGC) voltage as indicated by AGC voltage generator 7. In the preferred embodiment of the invention, a dc AGC voltage varying from 0 to about $-10$ volts may appear on lead 50 and will be utilized for gain control of the preamplifier 10 in each channel to ensure linear operation thereof.

The laser energy incident on laser detector 5 may vary over a wide range when installed in a missile or the like, due to many factors. When signals are weak, such as for both the maximum range case and the case when an obstruction or the like greatly reduces the laser detector signal, it is necessary that wideband amplifier 14 contribute minimum noise to the signal. Therefore, it is important that the automatic gain control action does not deteriorate the noise figure of wideband amplifier 14. Further, due to the nature of the laser guidance system, an exceptionally wide dynamic range for preamplifier 10 is required. To meet these requirements, the invention advantageously utilizes a plurality of cascaded stages which are gain controlled in a particular sequence to provide a wide dynamic range without deterioration of the noise factor of the preamplifier. To this end, wideband amplifier 14 is operated at its optimum low noise point and output amplifier 16 is provided which receives the greatly amplified signal therefrom. Wideband amplifier 14 may have a voltage amplification of 100, such that the overall noise figure of the entire preamplifier is therefore determined by that of wideband amplifier 14 and output amplifier 16 will contribute negligible noise to the signal. As may be recognized, the gain of output amplifier 16 may be varied during weak signal conditions without deteriorating the preamplifier noise figure. Advantageously, first AGC driver 24 is provided and controls the gain of output amplifier 16 over an AGC voltage range of 0 to $-2$ volts. It has been found that the input signal level to produce the $-2$ volt AGC voltage is such that the noise contribution of wideband amplifier 14 is negligible.

As the incoming signals increase to produce an AGC voltage greater than $-2$, four stage attenuator 12 is controlled by a novel four stage transistor control used with two driver stages, second ACG driver 18 and third AGC driver 20. As indicated in FIG. 1, the AGC voltage can vary over the range of $-2$ to $-4$ volts on lead 50 which causes second AGC driver 18 to continuously increase the attenuation of the first two stages of attenuator 12 to a maximum attenuation of 20 dB. As the signal increases further, third AGC driver 20 will cut in for AGC voltages in the range of $-4$ to $-7$ and will control attenuator 12 to cause the last two stages to increase the attenuation of attenuator 12 a maximum of about 30 dB. Therefore, attenuator 12 has a maximum attenuation capability of about 50 dB. It is to be understood that drivers 18 and 20 include internal biasing such that these particular stages will not be activated until the indicated threshold voltage is reached and that maximum attenuation will be achieved for the upper threshold voltage indicated. When the signal level rises above that which will produce about $-7$ volts AGC voltage, wideband amplifier 14 is controlled by fourth AGC driver 22 (which will cut in at about $-7$ volt level) and may have its gain reduced by about 30 dB as the AGC voltage rises to $-10$ volts, where it is to be understood that the use herein of the terms "rising" and "increasing" with reference to a negative AGC voltage refers only to the magnitude of the voltage without reference to its polarity.

Figure 6:
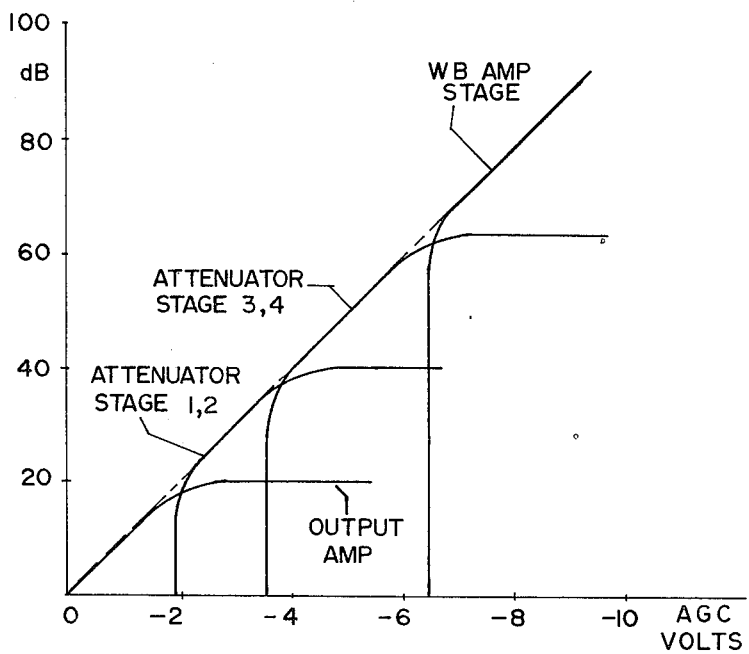
FIG. 6 is a graph of the automatic gain control characteristics of the preferred embodiment of the invention illustrating the control range of the various stages thereof.

The overall gain control characteristics of preamplifier 10 may be noted from FIG. 6 which shows in graphical form an overall reduction in gain of about 100 dB as the AGC voltage varies from 0 to $-10$ and indicating also the contribution of each of the gain controlled elements of preamplifier 10.

Figure 2:
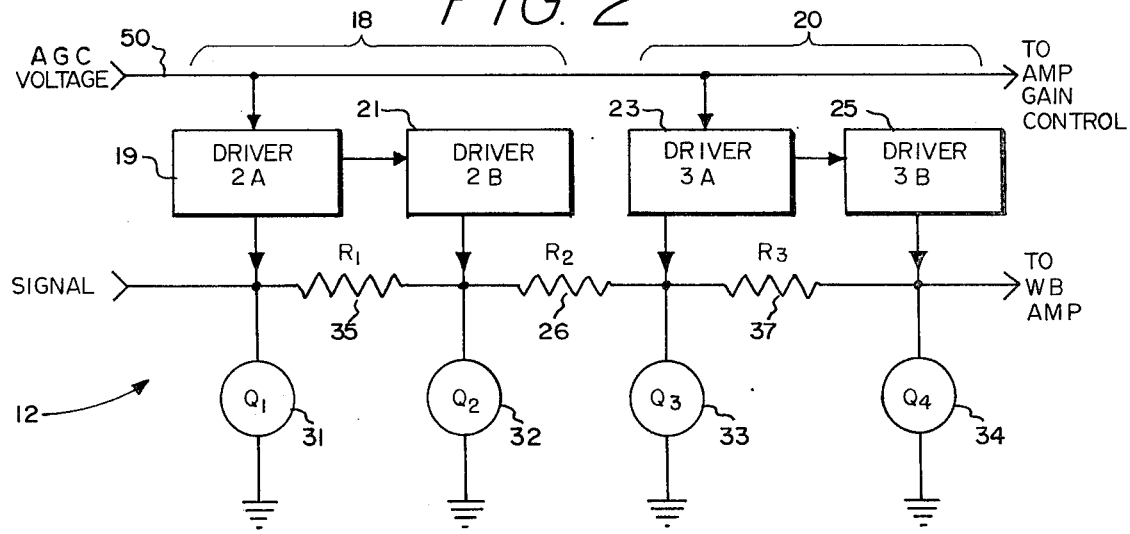
FIG. 2 is a functional diagram of the attenuator of FIG. 1.

Turning now to FIG. 2, a simplified functional block diagram of four stage attenuator 12 is shown. Basically, attenuator 12 is a network of four shorted-collector-base transistors 31, 32, 33, and 34 identified as Q1, Q2, Q3, and Q4 and three series resistors 35(R1), 26(R2), 37(R3). AGC driver 18 consists of two sections: driver 2A (19); and driver 2B (21). As an example of their operation, assume an AGC voltage greater than −2 volts appears at driver 2A, driver 2A then increases the flow of current through transistor Q1 which reduces its emitter dynamic resistance and a portion of the signal current is then shunted to ground and driver 2B will decrease the dynamic resistance of transistor Q2 shunting the signal at the junction of R1 and R2 to ground. As may now be understood, as more attenuation is required, transistors Q3 and Q4 will be controlled by driver 3A and 3B to bypass additional signal to ground as the AGC voltage increases from −4 to −7 volts to produce the desired attenuation.

Figure 3:
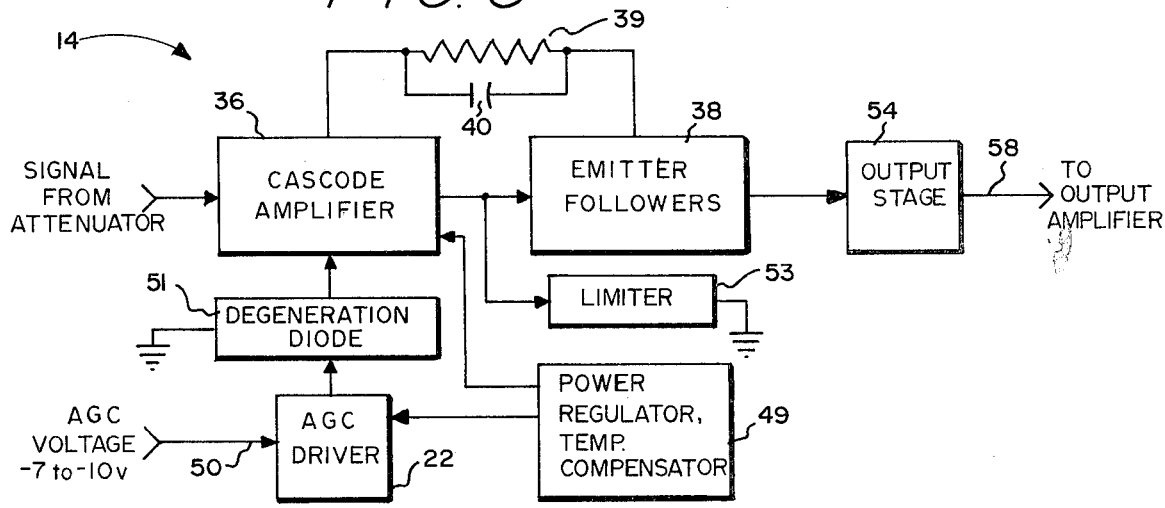
FIG. 3 is a functional block diagram of the low noise amplifier of FIG. 1.

FIG. 3 shows a simplified functional block diagram of wideband amplifier 14 which receives signals from attenuator 12. The input is a cascode amplifier 36 having the desired low noise characteristics. A complementary class AB output stage 54 which has low standby power dissipation and good output pulse response is driven by cascode amplifier 36 via a pair of emitter followers 38 which match the output impedance of amplifier 36 to the input impedance of output stage 54. A feedback network comprising resistor 39 and capacitor 40 is connected from the first emitter follower to the base of the common emitter cascode stage, as will be shown in more detail hereinafter, to obtain the proper pulse transimpedance. Capacitor 40 eliminates a high frequency peak in the response and, combined with the Miller capacitance, detector capacitance, and stray capacitances, defines the amplifier bandwidth. For example, in the preferred embodiment an amplifier bandwidth of greater than 16 MHz has been achieved. An AGC driver 22 receives the AGC voltage over line 50 and is biased to cut in at about −7 volts. As this voltage rises to −10 volts, the emitter impedance of the common emitter transistor of cascode amplifier 36 increases causing a gain reduction of about 30 dB.

Having described generally the operation of attenuator 12 and wideband amplifier 14 with the associated AGC drivers 18, 20, and 22, a detailed circuit description will be given with reference to FIG. 4. Second AGC driver 18 is shown as two stages 19 and 21. The input stage of driver 19, which receives AGC voltage over lead 50, is an emitter coupled differential pair 47 which includes large emitter degeneration resistors 55 to ensure good AGC linearity. This stage includes temperature compensated constant current sources and voltage references to provide uniform performance throughout the operating temperature range. The AGC voltage is input to driver 19 on lead 50 with the voltage appearing on the base of transistor 77 of differential pair 47 as divided by resistors 75 and 76. The opposite transistor 78 has its base controlled at a selected bias voltage of about 1.4 volts as determined by resistors 79 and 80. As may be noted the potentials on transistor 78 are regulated by temperature compensating diodes 81 and 82. An output occurs at the collector of transistor 78 only when the AGC voltage to driver 19 exceeds −2 volts, overcoming the selected bias voltage. The output from transistor 78 drives current mirror transistors 83 and 90 in parallel. Output transistor 43 for driver 19 is in series with transistor Q1 (31) of attenuator 12 between a positive and negative voltage supply. Since input stage 47 is biased to cut in at about −2 volts, transistor 43 begins to supply current to attenuation transistor 31 at this AGC voltage as previously discussed. Driver 2B (21) includes output transistor 44 connected to attenuation transistor Q2 (32) and supplies current thereto simultaneously with the current to transistor Q1 (31). Thus, transistors 31 and 32 are effective over the range of −2 to −4 volts from the AGC line to produce a maximum attenuation of about 20 dB. AGC voltage on lead 50 is also supplied to driver 3A (23) which in turn drives driver 3B (25). Input stage 48 of driver 3A (23) consisting of transistors 72 and 85 is similar to that previously described with respect to driver 2A (19) but biased to cut in at about −4 volts by resistors 70, 71, 73 and 74. Output transistors 45 and 46 of drivers 23 and 25, respectively serve to control the current through attenuation transistors 33 and 34. As previously discussed, increased current through transistors 31, 32, 33, and 34 increases the conductance thereof and bypasses portions of the signals to ground to produce the desired attenuation thereof.

The output from attenuator 12 is capacitively coupled to wideband, low noise amplifier 14. Input is to the base of transistor 57 which is part of the cascode connection with transistor 56. The bias on the base of transistor 56 is maintained at a constant voltage by zener 42. The gain of cascode stage 36 is controlled by AGC driver 22 utilizing an emitter coupled differential pair 65 driven from AGC lead 50. The output from driver 22 is fed on lead 17 to the emitter circuit of transistor 57. The emitter is biased through temperature compensating circuit 41 which is arranged to compensate the gain of cascode circuit 36 with changes in operating temperatures. When cascode 36 is operated at its highest gain, the bias current through diode 51 causes a dynamic impedance at the emitter of transistor 57 to be low. When the AGC voltage on lead 50 approaches about −7 volts, the current through diode 51 is caused to decrease by driver 22, thereby increasing the impedance at the emitter of transistor 57 which reduces the gain of cascode circuit 36. To prevent large noise spikes or other peak signals from overloading successive circuits, transistor 53 is connected across the output of cascode circuit 36 and biased to act as a limiter. Complementary class AB output stage 54 is driven by emitter followers 38 and produces an output signal on lead 58. Driver 22 utilizes emitter coupled differential pair 65 which is biased by resistors 88 and 89 and the AGC voltage input lead 50 through resistors 86 and 87 to cut in at about the desired −7 volt level.

Figure 5:
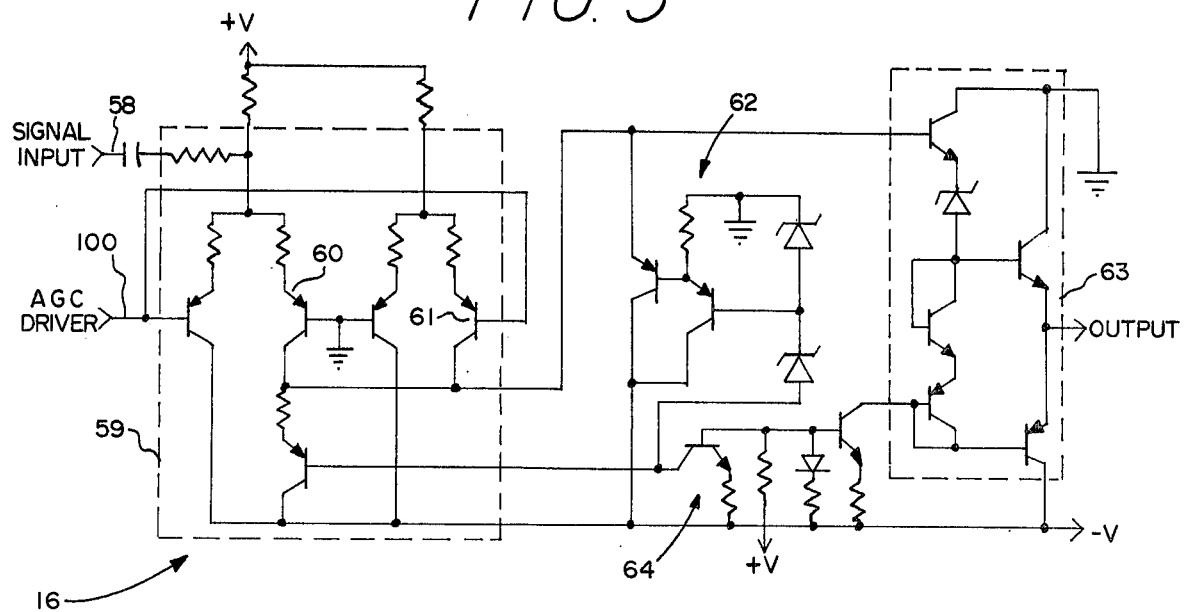
FIG. 5 is a typical schematic diagram of the preferred embodiment of the output amplifier of FIG. 1.

Turning now to FIG. 5, a typical schematic diagram of output amplifier 16 suitable for use in preamplifier 10 is shown. Amplifier 59 consists of two parallel differential stages arranged such that a signal on input lead 58 applied to the two emitters is directed to either of two collector loads by a differential control voltage on lead 100. One collector directs the signal current to the output circuit and the other collector directs the signal current to the supply line. Because the differential control voltage will change the dc voltage levels at the output, a parallel stage with no signal input is operated by the same control voltage in complementary fashion. The parallel arrangement prevents any dc shift by balancing the currents through the transistors. For example, when the current through transistor 60 is reduced the current through transistor 61 is increased by an equal amount. No offset bias is applied to AGC driver 24 so that the gain begins to decrease immediately upon the application of the AGC voltage. The total gain control occurs over the AGC voltage range of 0 to −2 volts. The AGC driver voltage on lead 100 is externally limited at an AGC voltage of about −2 volts so that the gain of amplifier 16 remains essentially constant for stronger input signals. The limiter 62 prevents peak overloading signals from passing through amplifier 16. A complementary class AB output stage 63 similar to output stage 54 of amplifier 14 is driven by amplifier 59 through an emitter follower. Temperature compensation circuits 64 are utilized to compensate for changes in operating temperatures of the amplifier.

Figure 4:
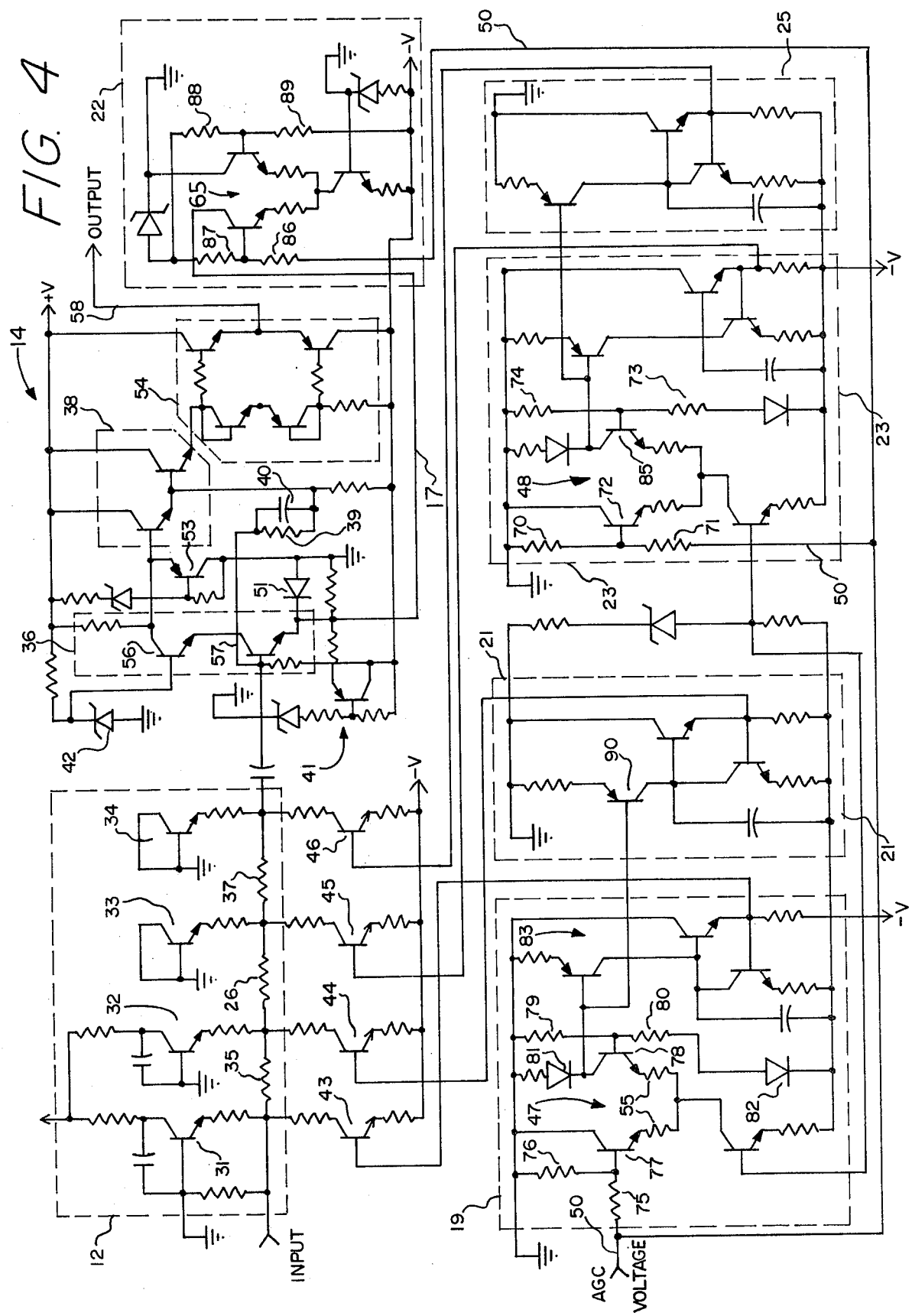
FIG. 4 is a typical schematic diagram for the attenuator and low noise amplifier shown in FIGS. 2 and 3.

The circuits shown in FIG. 4 and FIG. 5 are designed to facilitate implementation in monolithic form. Where certain diodes and zeners have been shown, it will be obvious to those of skill in the art that the type of transistors utilized in a monolithic version of the amplifiers may also be used in a shorted collector-based connection, as for example transistors 33 and 34 in FIG. 4, to act as diodes and such units connected in series to obtain a desired breakdown voltage.

In one implementation of these circuits, four complete attenuator-amplifier channels with their AGC drivers were fabricated as a single chip monolithic device. The temperature compensated current sources and voltage references used resulted in uniform performance for the majority of electrical parameters throughout the required operating temperature range. An interdigited emitter-base transistor structure was implemented for the input transistors in the wideband amplifiers to reduce the thermal noise voltage generated by the base resistance. A dielectrically isolated low noise linear bipolar process was selected for fabrication of the wafer.

A low noise wideband preamplifier circuit has now been disclosed in which the dynamic range can exceed 120 dB, which is linear, and which is protected from overload or saturation. A novel multistage gain control circuit has been shown adapted to be controlled by an external AGC voltage. A high level stage is first controlled at weak signal levels thereby maintaining the optimum noise figure of the preamplifier. The low noise characteristic of the preamplifier is maintained for moderate signal levels by delaying control of an attenuator ahead of the low noise amplifier portion of the preamplifier until the signal-to-noise ratio is sufficiently high that the attenuation ahead of the low noise amplifier will not degrade the overall noise performance. Finally, the low noise amplifier is controlled at very high signal levels to greatly extend the dynamic range of the preamplifier. Although the preamplifier of the invention is particularly suited for use in laser controlled guided missiles and the like, it is equally adaptable to any systems requiring low noise, high dynamic range, and a wide bandwidth.

Although specific circuits have been shown, it is to be understood that such are for exemplary purposes only and many alternative circuits, circuit arrangements and bias levels, as will be obvious to those of skill in the art, may be used without departing from the scope or the spirit of the invention.

We claim:

1. A gain controlled low noise preamplifier having a large dynamic range comprising:
    output amplifier means having a signal input, a signal output, and a gain control voltage input, said output amplifier means having its gain reduced by an external dc voltage applied to said gain control input as said external voltage increases from essentially zero to a first preselected value, said reduction in gain proportional to said applied external dc voltage;
    attenuator means having a pair of input terminals and a pair of output terminals, each of said pairs having a common ground terminal, said input terminals for receiving an input signal, said attenuator means having a gain control voltage input and having its attenuation increased by said external dc voltage applied to said attenuation control input only when said external voltage increases from said first preselected value to a second preselected value, said attenuator means thereby reducing the amplitude of the input signal appearing at said output terminals over a range proportional to the value of said external dc voltage between said first preselected value and said second preselected value; and
    low noise amplifier means having a signal input connected to said output terminals of said attenuator means, a signal output connected to said signal input of said output amplifier means, and a gain control input for receiving said external voltage when the magnitude thereof is greater than said second preselected value, the gain of said low noise amplifier means being reduced as said external voltage increases from said second preselected value, said gain reduction proportional to the magnitude of said external dc voltage;
    wherein said external dc voltage is proportional to the magnitude of said input signal, and said reductions in gain of said preamplifier do not significantly reduce the noise figure of said preamplifier.

2. The preamplifier as defined in claim 1 in which said attenuator means comprises:
    at least one control transistor connected essentially in parallel with said input terminals to bypass a portion of said input signal to ground, such portion being essentially proportional to the dynamic conductance of said transistor; and
    driver means having an input connected to said attenuator control input for receiving said external dc voltage and an output connected to said control transistor, said driver means responsive only to said external dc voltage between said first preselected value and said second preselected value to vary the dc current through said control transistor for controlling said dynamic conductance of said control resistor essentially proportional to such external dc voltage.

3. The preamplifier as defined in claim 1 in which said attenuator means comprises:
    a plurality of resistors connected in series between said input and said output;
    a plurality of control transistors, one of said control transistors being connected between each resistor and said ground terminals for bypassing a portion of said input signal to ground, said portion being essentially proportional to the dynamic conductance of said control resistor; and
    a plurality of driver means having inputs connected to said attenuator control input for receiving said external dc voltages, one of said driver means connected to each of said control transistors to vary the dynamic conductance thereof responsive to said external dc input voltage between said first preselected value and said second preselected value, said plurality of driver means adapted to control said plurality of transistors successively in a preselected sequence.

4. The preamplifier as defined in claim 1 in which said low noise amplifier means comprises:

a cascode connected transistor amplifier adapted to have a low noise figure;

driver means having an input connected to said attenuator control for receiving said external dc voltage and an output connected to said cascode transistor amplifier, said driver means responsive only to said external dc voltages greater than said second preselected value for reducing the gain of said cascode amplifier proportional to such external dc voltage;

emitter follower means having an input connected to the output of said cascode amplifier; and the input of said output amplifier means connected to the output of said emitter follower means, said emitter follower means serving to match the output impedance of said cascode amplifier to the input impedance of said output amplifier means.

5. The preamplifier as defined in claim 4 in which said cascode amplifier further includes feedback means for controlling the transimpedance of said cascode amplifier.

6. The preamplifier as defined in claim 4 in which said output amplifier means is a complementary class AB transistor amplifier.

7. The preamplifier as defined in claim 4 in which said cascode transistor amplifier includes:

an input transistor having a bias current diode connected to the emitter thereof thereby producing a low emitter dynamic impedance; and said output of said driver means is connected to said diode to cause a decrease in the bias current therethrough responsive to the increase in said external dc voltage thereby increasing said emitter dynamic impedance and decreasing the gain of said cascode amplifier.

8. In a missile control system having a dc control voltage generating means for producing a dc automatic gain control voltage proportional to the magnitude of an input signal, a preamplifier for amplifying said input signal, said preamplifier having a low noise characteristic over a wide dynamic range, comprising:

attenuator means for receiving said input signal;

low noise amplifier means connected to receive the input signals from said attenuator means;

output amplifier means for receiving the amplified signals from said low noise amplifier means;

first automatic gain control driver means connected to said output amplifier for controlling the gain of said output amplifier proportional to the magnitude of said dc automatic gain control voltage only when said input signal is within a first amplitude range representative of a weak input signal level range;

second automatic gain control driver means connected to said attenuator means for increasing attenuation of said attenuator to said input signal only when the amplitude of said input signal is within a second amplitude range having a minimum amplitude greater than the highest amplitude of said first amplitude range; and third automatic gain control driver means connected to said low noise amplifier means for reducing the gain of said low noise amplifier means when the amplitude of said input signal is greater than the highest amplitude of said second amplitude range;

wherein the noise contribution of said low noise amplifier is negligible when the amplitude of said input signal is greater than the highest amplitude of said first amplitude range.

9. The preamplifier as defined in claim 8 in which said first amplitude range of said first automatic gain control driver means is selected to extend from a minimal detectable signal level to a signal level for which the noise level of said low noise amplifier means is negligible.

10. The preamplifier as defined in claim 8 in which said output amplifier means comprises two differential amplifier stages in parallel having the signal gain of one of said stages controlled by said dc automatic gain control voltage and the second of said stages adapted to balance the change in current as said first stage changes gain responsive to said external dc voltage to thereby prevent a dc shift in the amplified input signal.

11. The preamplifier as defined in claim 10 in which said output amplifier means further comprises emitter follower means connected to said parallel stages and a complementary class AB output stage connected to said emitter follower.

12. The preamplifier as defined in claim 8 in which said low noise amplifier means comprises:

a first and second transistor connected together in a cascode connection;

a limiter connected to the output of said cascode amplifier for limiting the peak value of amplified signals to a preselected level;

a complementary class AB output stage for driving said output amplifier means; and emitter follower circuit connected between the output of said cascode amplifier and the input of said complementary class AB output stage for matching of impedances.

13. The preamplifier as defined in claim 8 in which said attenuator means comprises:

a pair of input terminals having one terminal thereof connected to a common ground;

at least one control transistor connected essentially in parallel with said input terminals to bypass a portion of said input signal to ground, such portion being essentially proportional to the dynamic conductance of said transistor; and said second automatic gain control driver means having an input for receiving a dc automatic gain control voltage and an output connected to said control transistor, said driver means adapted to vary the dc current through said control transistor responsive to said dc automatic gain control voltage within a first voltage range for controlling said dynamic conductance of said control transistor essentially proportional to said automatic gain control voltage.

14. The preamplifier as defined in claim 8 in which said attenuator means comprises:

an input and an output having a common ground;

a plurality of resistors connected in series between said input and said output;

a plurality of control transistors, one of said control transistors being connected between each resistor and said ground for bypassing a portion of said input signal to ground, said portion being essentially proportional to the dynamic conductance of said control transistor; and said second automatic gain control driver means having a plurality of inputs for receiving said dc automatic gain control voltage and a plurality of outputs connected to said control transistors and adapted to independently vary the dynamic conductance of each responsive to said dc automatic gain control voltage within a first voltage range, said driver means adapted to control said plurality of transistors successively in a preselected sequence.

15. The preamplifier as defined in claim 8 in which said low noise amplifier means comprises:
   a cascode connected transistor amplifier adapted to have a low noise figure;
   said third automatic gain control driver means having an input for receiving said dc automatic gain control voltage and an output connected to said cascode transistor amplifier, said driver means responsive only to said dc automatic gain control voltages within a second voltage range for reducing the gain of said cascode amplifier proportional to said voltage;
   emitter follower means connected to the output of said cascode amplifier for impedance transformation; and
   said output amplifier means input is connected to the output of said emitter follower means, said emitter follower means serving to match the output impedance of said cascode amplifier to the input impedance of said output amplifier means.

16. The preamplifier as defined in claim 15 in which said cascode amplifier further includes feedback means for controlling the transimpedance of said cascode amplifier.

17. The preamplifier as defined in claim 16 in which said output amplifier means is a complementary class AB transistor amplifier.

18. The preamplifier as defined in claim 15 in which said cascode transistor amplifier includes:
   an input transistor and a bias current diode connected to the emitter of said input transistors thereby producing a low emitter dynamic impedance thereof; and
   said driver means is connected to said diode to cause a decrease in the bias current of said diode responsive to the increase in said dc automatic gain control voltage thereby increasing said emitter dynamic impedance and decreasing the gain of said cascode amplifier.

* * * * *